(12) United States Patent
Dufrene et al.

(10) Patent No.: US 8,781,414 B2
(45) Date of Patent: Jul. 15, 2014

(54) ENVELOPE DETECTOR AND METHOD FOR DETECTING AN ENVELOPE OF A SIGNAL TO BE AMPLIFIED BY A POWER AMPLIFIER

(71) Applicant: Intel Mobile Communications GmbH, Neubiberg (DE)

(72) Inventors: Krzysztof Dufrene, Plesching (AT); Harald Pretl, Schwertberg (AT); Patrick Ossmann, Linz (AT)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 13/710,625

(22) Filed: Dec. 11, 2012

(65) Prior Publication Data

US 2014/0162576 A1 Jun. 12, 2014

(51) Int. Cl.
*H04B 1/04* (2006.01)
(52) U.S. Cl.
USPC .......... 455/114.3; 455/91; 455/102; 455/108; 455/118; 330/127; 330/135; 330/136; 327/58; 327/59
(58) Field of Classification Search
CPC ..... H04B 1/02; H04B 1/04; H04B 2001/0408
USPC ................ 455/91, 102, 108, 110, 114.3, 118, 455/127.1, 127.3; 330/127, 135, 136; 327/58, 59
See application file for complete search history.

(56) References Cited

U.S. PATENT DOCUMENTS

| | | | | |
|---|---|---|---|---|
| 2007/0040618 A1* | 2/2007 | Ahmed et al. | ............. | 331/16 |
| 2009/0096521 A1* | 4/2009 | Liu et al. | ............. | 330/149 |
| 2012/0242413 A1* | 9/2012 | Lesso | ............. | 330/297 |
| 2012/0275544 A1* | 11/2012 | Midya et al. | ............. | 375/297 |
| 2013/0072139 A1* | 3/2013 | Kang et al. | ............. | 455/114.3 |

OTHER PUBLICATIONS

N. Ceylan, et al.; "Optimization of EDGE Terminal Power Amplifiers Using Memoryless Digital Predistortion"; IEEE Trans. Microw. Theory Tech., vol. 53, No. 2, pp. 515-522, Feb. 2005.
S. Kusunoki, et al.; "Load-Impedance and Bias-Network Dependence of Power Amplifier with Second Harmonic Injection", IEEE Trans. Microw. Theory Tech., vol. 52, No. 9, pp. 2169-2176, Sep. 2004.
V. Leung, et al.; "Analysis of Envelope Signal Injection for Improvement of RF Amplifier Intermodulation Distortion", IEEE Journal of Solid-State Circuits, vol. 40, No. 9, pp. 1888-1894, Sep. 2005.
B. Koo, et al.; "Integrated Bias Circuits of RF CMOS Cascode Power Amplifier for Linearity Enhancement"; IEEE Trans. Microw. Theory Tech.; vol. 60, No. 2, pp. 340-351, Feb. 2012.

\* cited by examiner

*Primary Examiner* — Tuan Pham
(74) *Attorney, Agent, or Firm* — Eschweiler & Associates, LLC (57) ABSTRACT

An envelope detector includes an input receiving a digital input signal indicative of a magnitude of a signal to be amplified by a power amplifier. A circuit is provided for generating an analog envelope signal based on the digital input signal. The envelope detector includes an output for outputting the analog envelope signal.

9 Claims, 7 Drawing Sheets

ENVELOPE DETECTOR AND METHOD FOR DETECTING AN ENVELOPE OF A SIGNAL TO BE AMPLIFIED BY A POWER AMPLIFIER

FIELD

The present disclosure is in the field of mobile communications and more particularly is related to an apparatus and method of envelope detection in a power amplifier.

BACKGROUND

In order to improve the performance of amplifiers, for example to boost the linearity of power amplifiers (PA), like their ACLR (adjacent channel leakage ratio) performance, which is related to third order intermodulation distortions, some sort of power amplifier linearization may be applied. Such power amplifier linearization may be obtained either by applying a predistortion approach or by applying an analog envelope or second harmonic injection approach. Implementing such approaches may, however, complicate the overall system.

SUMMARY

An envelope detector includes an input configured to receive a digital input signal indicative of a magnitude of a signal to be amplified by a power amplifier, a circuit for generating an analog envelope signal based on the digital input signal, and an output configured to output the analog envelope signal.

DETAILED DESCRIPTION

Figure 1:
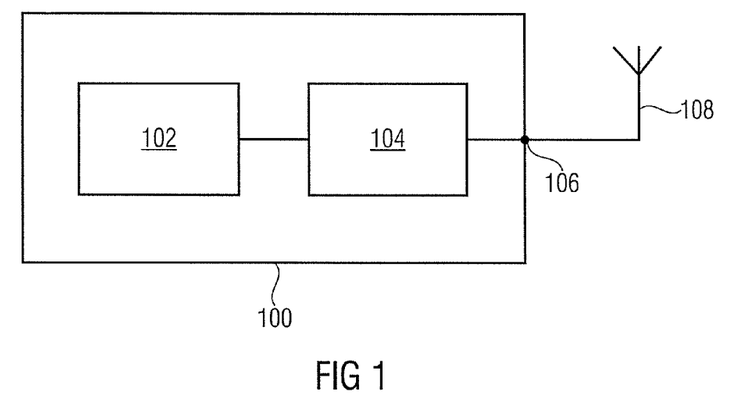
FIG. 1 shows a block diagram of an example mobile communication device.

FIG. 1 shows a block diagram of an example mobile communication device 100 comprising a digital baseband processor 102 and an RF front end 104 coupled to the baseband processor 102 and to an antenna port 106. The antenna port 106 is provided to allow connection of an antenna 108 to the mobile communication device 100. The baseband processor 102 generates signals to be transmitted via the antenna 108 which are forwarded to the RF front end 104 generating a transmit signal output to the antenna port 106 for transmission via the antenna 108. The RF front end 104 may also receive signals via the antenna port 106 from the antenna 108 and provides respective signals to the baseband processor 102 for processing the received signals. The apparatus and the method described in further detail in the following may be implemented in the baseband processor 102 in one embodiment, for example in a processor operating on data signals for generating the respective input signals to the RF front end 104, and/or in the RF front end 104, like in a polar transmitter used for generating the transmit signal output at antenna port 106 based on the input signals received from the baseband processor.

The mobile communication device 100 may be a portable mobile communication device and may be configured to perform a voice and/or data communication according to a mobile communication standard with other communication devices, like other mobile communication devices or base stations of a mobile communication network. Mobile communication devices may comprise a mobile handset, such as a mobile phone or a smart phone, a tablet PC, a broadband modem, a laptop, a notebook, a router, a switch, a repeater or a PC. Also, the mobile communication device 100 may be a base station of a communication network.

For increasing the performance of amplifiers, for example power amplifiers, their linearity may be boosted, for example by applying an appropriate PA linearization approach. One approach is based on the injection of the envelope of the input signal to the biasing network of the power amplifier, which results, in general, in a modification of the envelope dependent on the input signal. This approach may be applied both to external and integrated power amplifiers.

Figure 2:
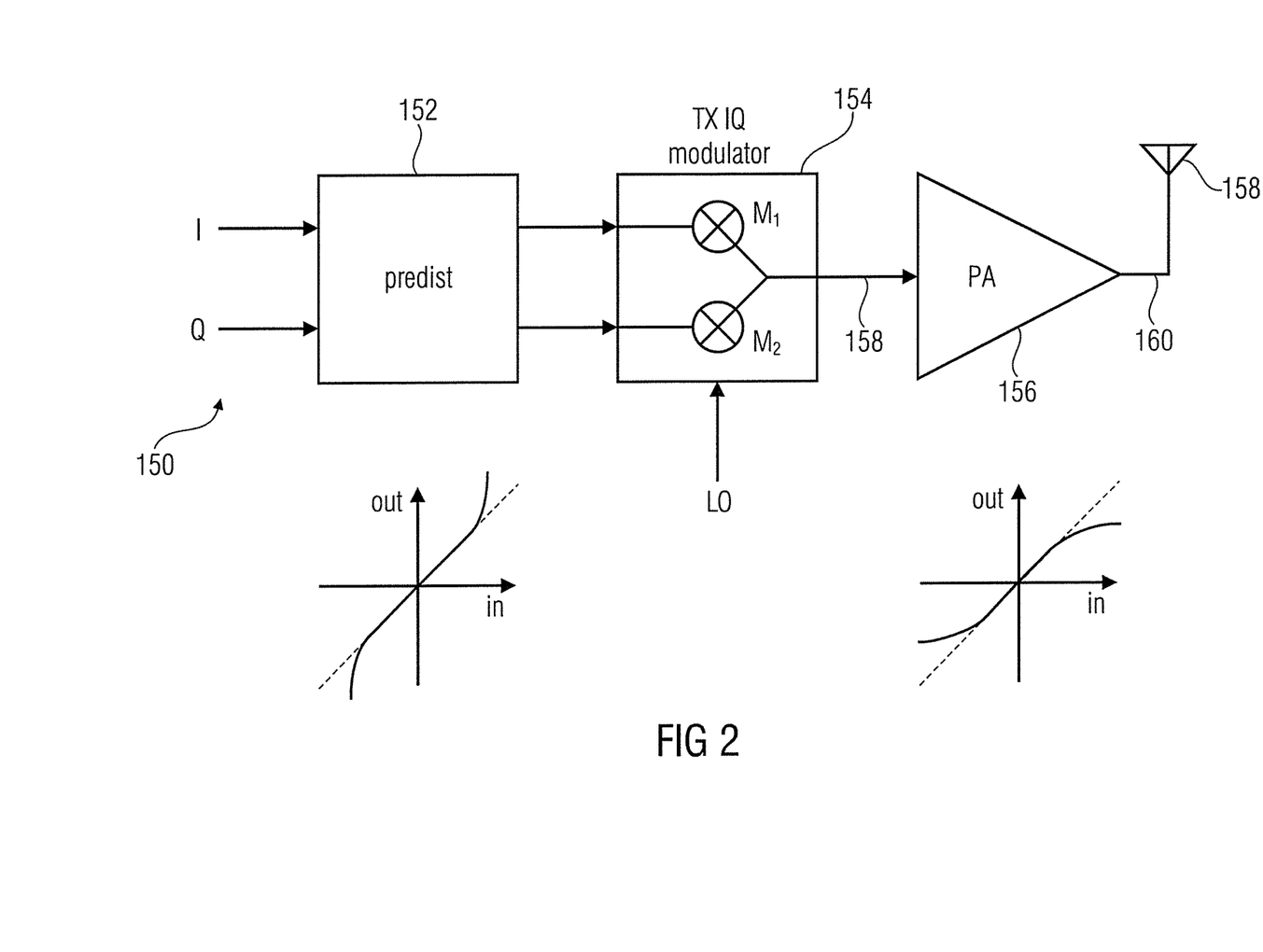
FIG. 2 shows an example of a line-up of an IQ-modulator base transmitter comprising an embedded predistorter.

Power amplifiers may be linearized using either predistortion approaches or analog envelope or second harmonic (H2) injection approaches. FIG. 2 shows an example of a line-up of an IQ-modulator base transmitter 150 comprising an embedded predistorter 152, an IQ-modulator 154, a power amplifier 156 and an antenna 158. The predistorter 152 receives from a baseband processor (not shown) operating in the digital Cartesian domain the I- and Q-signals and outputs predistorted I- and Q-signals to the modulator 154. The modulator 154 further receives an LO-signal and includes mixers $M_1$ and $M_2$ for converting the predistorted I-signal and the predistorted Q-signal by mixing them with the LO-signal (local oscillator signal). Further, the IQ modulator generates an analog output signal 158 that is applied to the power amplifier 156 for amplifying the signal using the desired gain and outputting the amplified signal 160 to the antenna 158. In FIG. 2, in the lower part, the respective characteristics of the power amplifier 156 and the predistorter 152 with regard to a linear input signal are shown. The predistorter 152 predistorts the input signal at higher input levels in a way opposite or complementary to the way the power amplifier operates in its non-linear operating regions. The predistortion is usually carried out in the digital domain prior to the digital-to-analog conversion and it is based on a look-up table (LUT) containing complex coefficients which enable both scaling and rotation of the baseband signal constellation. A similar approach as depicted in FIG. 2 can be applied when using a polar transmitter, and in this case, the signals to be predistorted would be the magnitude signal and the phase signal obtained from the baseband processor.

The predistortion approaches can be classified into static and dynamic (adaptive) approaches. A static predistortion modifies the input signal according to a fixed formula, independent of variations of, for example the process, the temperature and the supply voltage. The adaptive predistortion uses information, for example about the temperature, the process and the supply voltage, to parameterize the predistorter transfer function. However, this complicates the overall system, especially as far as obtaining process information is concerned, because this, in general, requires some kind of feedback from the transmitter output (in the analog domain) to the digital domain, for example, it is necessary to provide some kind of feedback receiver.

Figure 3:
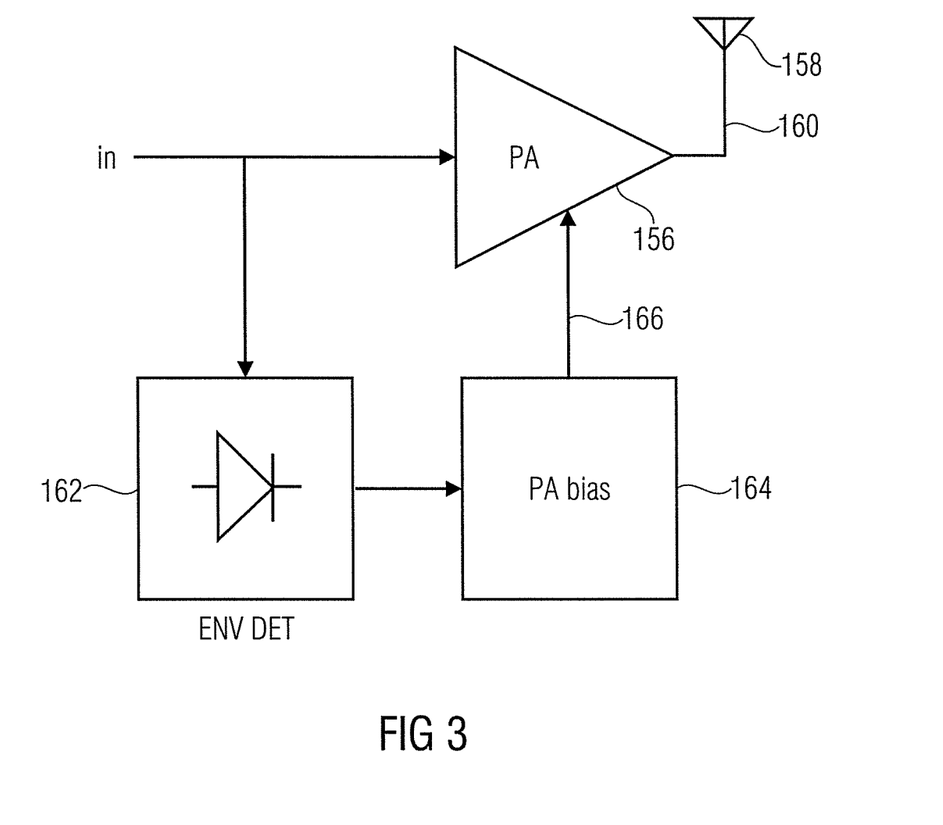
FIG. 3 shows a schematic representation of the envelope injection approach.

FIG. 3 shows a schematic representation of the envelope injection approach. The circuit shown in FIG. 3 comprises the power amplifier 156 receiving at an input IN the analog signal to be amplified. The circuit further comprises the envelope detector 162 which also receives the analog signal at the input IN and derives from the analog signal information about the magnitude. Based on this information, the envelope detector 162 generates an output signal for controlling a power amplifier bias circuit 164 which, dependent on the control signal received from the envelope detector 162 selects or generates an appropriate bias signal 166 that is applied to the power amplifier PA. The power amplifier 156 operates in accordance with the bias signal 166 for generating the amplified output signal 160 to be applied to the antenna 158 for transmission. The instantaneous envelope (or H2) of the input signal IN is detected by means of the analog envelope detector 162, and the main amplifier biasing is dynamically modified. This approach is disadvantageous as it is necessary to provide an analog active circuit for envelope detection, namely the envelope detector 162, which consumes additional power. Further, this approach is not directly compatible with power amplifiers driven with digital input signals.

Figure 4:
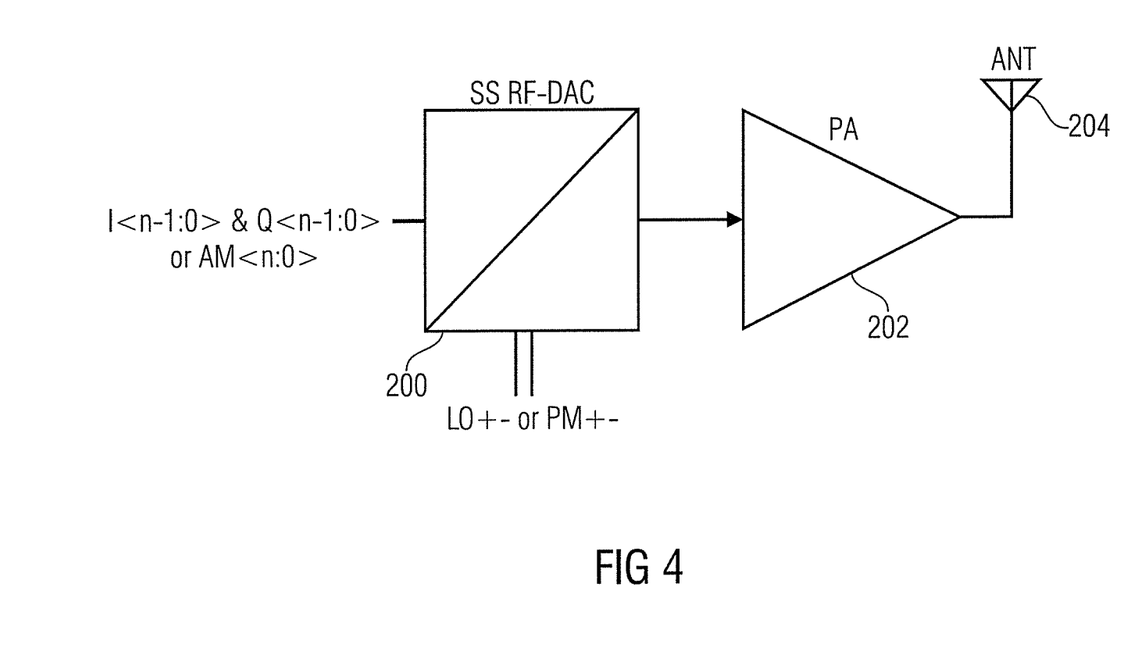
FIG. 4 shows a general block diagram of a circuit including a small signal RF-DAC (RF Digital-to-Analog-Converter) followed by a separate power amplifier.

FIG. 4 shows a general block diagram of a circuit including a small signal RF-DAC 200 (SS RF-DAC) followed by a separate power amplifier 202 (PA) which is coupled to an antenna 204. The circuit of FIG. 4 may be operated in the Cartesian (I/Q) domain or in the polar domain. When being operated in the Cartesian (I/Q) domain, the small signal RF-DAC 200 receives at a first input the I-signal I<n−1:0> and the Q-signal Q<n−1:0>, e.g. from a baseband processor, and at a second input a first local oscillator signal LO+ and a second local oscillator signal LO−. When being operated in the polar domain, the small signal RF-DAC 200 receives at the first input the amplitude signal AM<n−1:0>, and at the second input the phase signal PM<n−1:0>. The amplitude and phase signals may be provided by a baseband processor.

Figure 5:
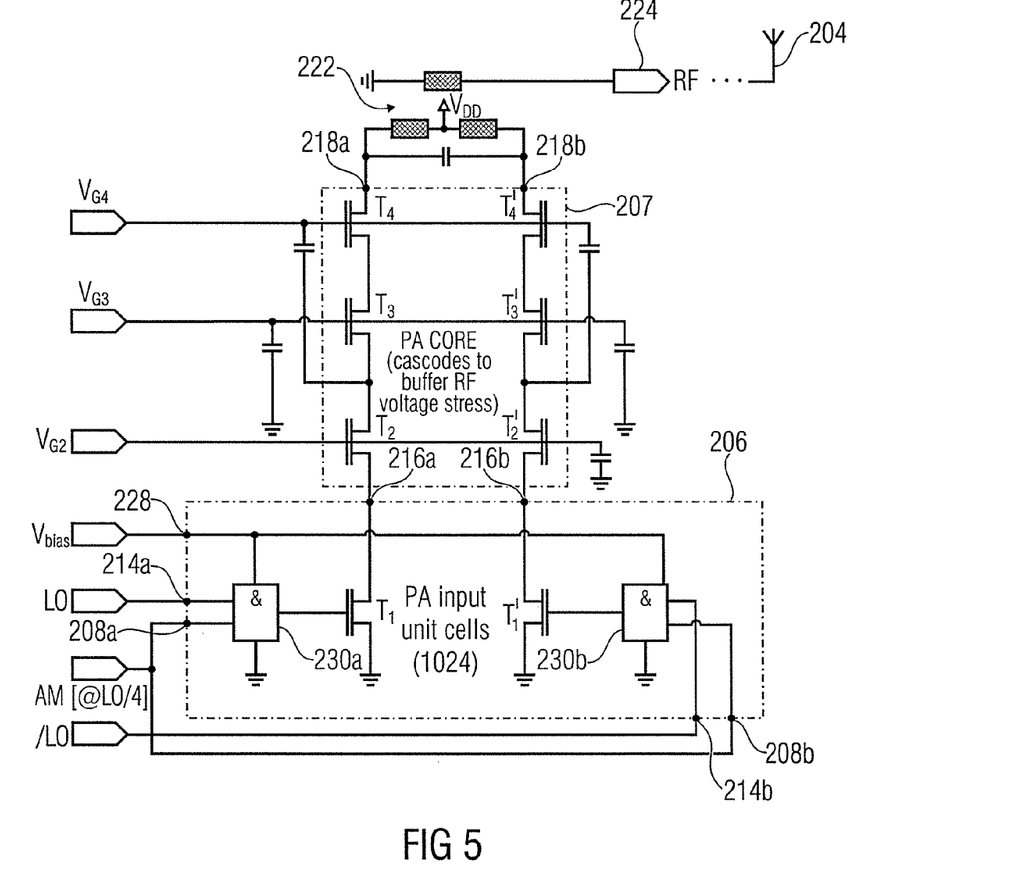
FIG. 5 shows a circuit including an RF-DAC and a power amplifier which are merged into one block.

FIG. 5 shows a circuit including an RF-DAC and a power amplifier which are merged into one block so that the circuit shown in FIG. 5 may be called a power DAC (PWR-DAC). The circuit comprises an RF-DAC 206 and a cascode buffering stage 207 that may be coupled to an antenna 204. The signals for controlling the RF-DAC cell 206 may be provided based on the signals from a baseband processor which may operate in the polar domain, thereby providing as output the amplitude component and the phase component of the baseband signal. The amplitude component forms a control signal for the respective RF-DAC cells 206 of which in FIG. 5 a plurality may be provided, for example 1024. However, for clarity reasons, only a single cell 206 is depicted in FIG. 5. Further, the phase component provided by the baseband processor to a local oscillator source is provided for generating the local oscillator signals LO, /LO supplied to the RF-DAC cell 206.

In the circuit of FIG. 5, the RF-DAC cell 206 includes the control inputs 208a and 208b receiving the amplitude signal from the baseband processor as well as the control inputs 214a and 214b for receiving the LO signals LO, /LO. Further, the RF-DAC cell 206 includes a bias input 228 for receiving a bias signal. The RF-DAC cell 206 includes a first logic block 230a and a second logic circuit 230b, for example AND-Gates. The AND-Gate 230a receives the signal from inputs 208a and 214a and generates an output signal for controlling a transistor $T_1$ coupled between a reference potential and the first output 216a of the RF-DAC cell 206. Likewise, the AND-Gate 230b receives the signals from the inputs 208a and 214b and generates a control signal for controlling transistor $T_1'$ coupled between the second output 216b and the reference potential. The AND-Gates 230a and 230b further receive the bias signal $V_{BIAS}$ from the bias input 228.

The cascode buffering stage 207 comprises three stages, each stage comprising a pair of transistors, for example field effect transistors. The cascode buffering stage 207 may comprise in a first stage the two transistors $T_2$ and $T_2'$, in a second stage the transistors $T_3$ and $T_3'$, and in a third stage the transistors $T_4$ and $T_4'$. The first transistors $T_2$ to $T_4$ of the three stages are connected in series between the first output 216a of the RF-DAC cell 206 and a first output 218a of the cascode buffering stage 207, and the second transistors $T_2'$ to $T_4'$ of the three stages are connected in series between the second output 216b of the RF-DAC cell 206 and a second output 218b of the cascode buffering stage 207. The respective stages receive control signals $V_{G2}$ to $V_{G4}$ for activating/deactivating or selecting the respective stages so that a signal applied to the cascode buffering stage 207 is amplified by one or more of the stages for providing a respectively amplified signal at the outputs 218a and 218b. The cascode buffering stage 207 provides at its outputs 218a and 218b a differential RF output signal. The differential output signal present at the outputs 218a and 218b of the cascode buffering stage 207 is coupled via a transformer 222 to an RF output terminal 224 which may be coupled to the antenna 204. The circuit shown in FIG. 5 may, for example, be used in a further step of transmitter integration in which the RF-DAC circuit and the PA circuit are merged into the above referenced one block, the power-DAC block.

Examples of the apparatus and methods for detecting an envelope may be used together with a circuit for amplifying a signal. The signal to be amplified is based on a digital signal so that a digital to RF power conversion is carried out. However, the envelope of the modulating signal can be estimated without the need for analog envelope detectors as the envelope information is already contained in the digital signal and can be used also for linearization purposes, as shall be described in further detail below.

For example in the field of wireless transmitters, the power amplifiers may be CMOS power amplifiers which can be integrated on the same die as the rest of the wireless transmitter chain, including the digital parts. In this case, but also in case of an external power amplifier (e.g. magnetically coupled to the signal processing circuit), a digital to RF power conversion is possible which opens the possibility of estimating the envelope of the modulating signal without the need for analog envelope detectors, rather, the information already contained in the digital signal is used also for linearization purposes, as shall be described in further detail below.

Examples of the apparatus and methods for detecting an envelope are suited for mixed-signal power amplifiers like the one shown in FIG. 5. In this circuit architecture, the RF digital-to-analog converter contains an array of unit cells switching their unit currents to either of two differential branches depending on the state of a phase modulated LO-signal. Each unit cell is activated based on a magnitude codeword. The amount of unit current is set with a biasing voltage Vbias. The biasing voltage for the respective cells 206 in FIG. 5 and also the biasing voltages for the cascode buffering stage 207 may be dynamically adjusted.

Figure 6:
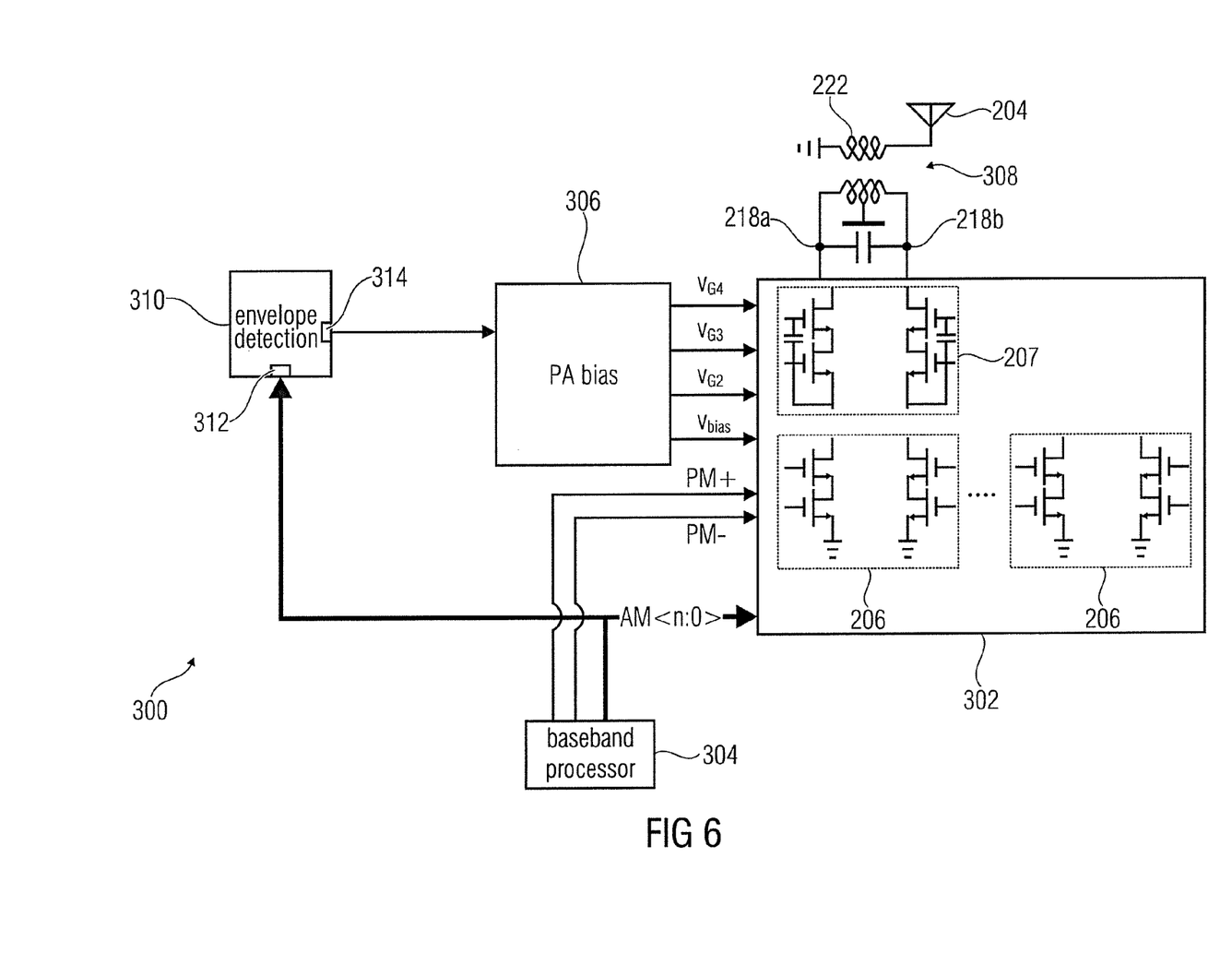
FIG. 6 shows an example transmitter including an example of an envelope detector operating on the basis of a digital input signal indicative of a magnitude of the signal to be amplified.

FIG. 6 shows an example transmitter including an example of an envelope detector operating on the basis of a digital input signal indicative of a magnitude of the signal to be amplified. The transmitter 300 comprises a polar power DAC 302 which may comprise the cascode buffering stage 207 and a plurality of power amplifier input unit cells 206 described above with regard to FIG. 5. In the example shown in FIG. 6, the polar power DAC 302 is an integrated polar power DAC as depicted and explained with regard to FIG. 5. Alternatively, also a circuit as described with regard to FIG. 4 might be implemented. The power DAC 302 is coupled to the baseband processor 304 which operates in the polar domain and provides to the power DAC 302 the phase modulation signals PM+ and PM− for generating the local oscillator signals described above with regard to FIG. 5. Also, the amplitude signal is supplied to the power DAC 302. The transmitter further comprises a power amplifier bias circuit 306 that is connected to the power DAC 302 for providing the bias signals VG2 to VG4 for operating the cascode buffering stage 207 and also for providing the signal Vbias applied to the respective cells 206. The transmitter further comprises an output stage 308 coupled between the antenna 226 and the outputs 218a and 218b of the cascode buffering stage 207.

In addition, the transmitter 300 comprises an envelope detector 310. The envelope detector 310 may be provided as part of the transmitter 300, however, it is noted that the envelope detector may also be provided as a separate entity from the transmitter. The envelope detector 310 comprises an input 312 that may be coupled to the baseband processor 304 for receiving from the baseband processor the magnitude signal that is also applied to the power DAC 302. The envelope detector 310 operates on the basis of the digital input signal provided at input 312 and generates an analog envelope signal provided at the output 314 of the envelope detector 310 by converting the digital input signal 312 into the analog signal 314. The envelope detector 310 may be coupled to the PA bias circuit 306 for applying the analog envelope signal to this circuit which, in turn, on the basis of the analog signal modifies the bias signal to be applied to the cascode buffering stage 207 and the PA input stage (Vbias). The envelope detector 310 provides a signal allowing to modify the operating points (biasing points) of the cascode buffering stage 207, thereby improving the linearity. The envelope detector 310 exploits the digital envelopes (magnitude) information already provided at the input of the DAC 302.

The envelope detector 310 is advantageous as there is no need for detecting the magnitude of the signal to be amplified in the analog domain, i.e. there is no need for an analog envelope detector as described above with regard to FIG. 3, as the magnitude signal is readily available as input to the DAC 302. This reduces the power consumption of the entire envelope injection system.

Further examples of the envelope detector 310 that will be described below, allow to provide further digital processing of the digital magnitude signal, for example, for a better compensation of odd order non-linearity. A digital bandwidth reduction of the digital magnitude signal may be carried out for reducing the sampling rate required for converting the digital magnitude signal into the analog envelope signal.

The above described envelope detector 310 may be used instead or together with a digital predistortion approach, like the approach mentioned above with regard to FIG. 2. In case the digital predistortion approach is implemented as static-only (no adaption for process variations), the power amplifier which will be pre-linearized to the envelope injection, will require a predistortion to a lesser extent, which, in turn, leads to lower variations from the optimal transfer function over PVT (process-voltage-temperature).

Further, in FIG. 6 an example has been described in which the baseband processor 304 operates in the polar domain, thereby providing the phase signals PM+ and PM− and the magnitude signal. However, the envelope detector 310 may also be used in power-DACs operating in the IQ modulation mode. When using the polar mode, the magnitude signal provided directly by the baseband processor is readily available. In case of the IQ modulation mode, the input signal 312 to the envelope detector 310 includes the I- and Q-signals and the envelope detector, in addition, is capable to estimate the magnitude of the complex baseband signal based on the I- and Q-signals.

Figure 7:
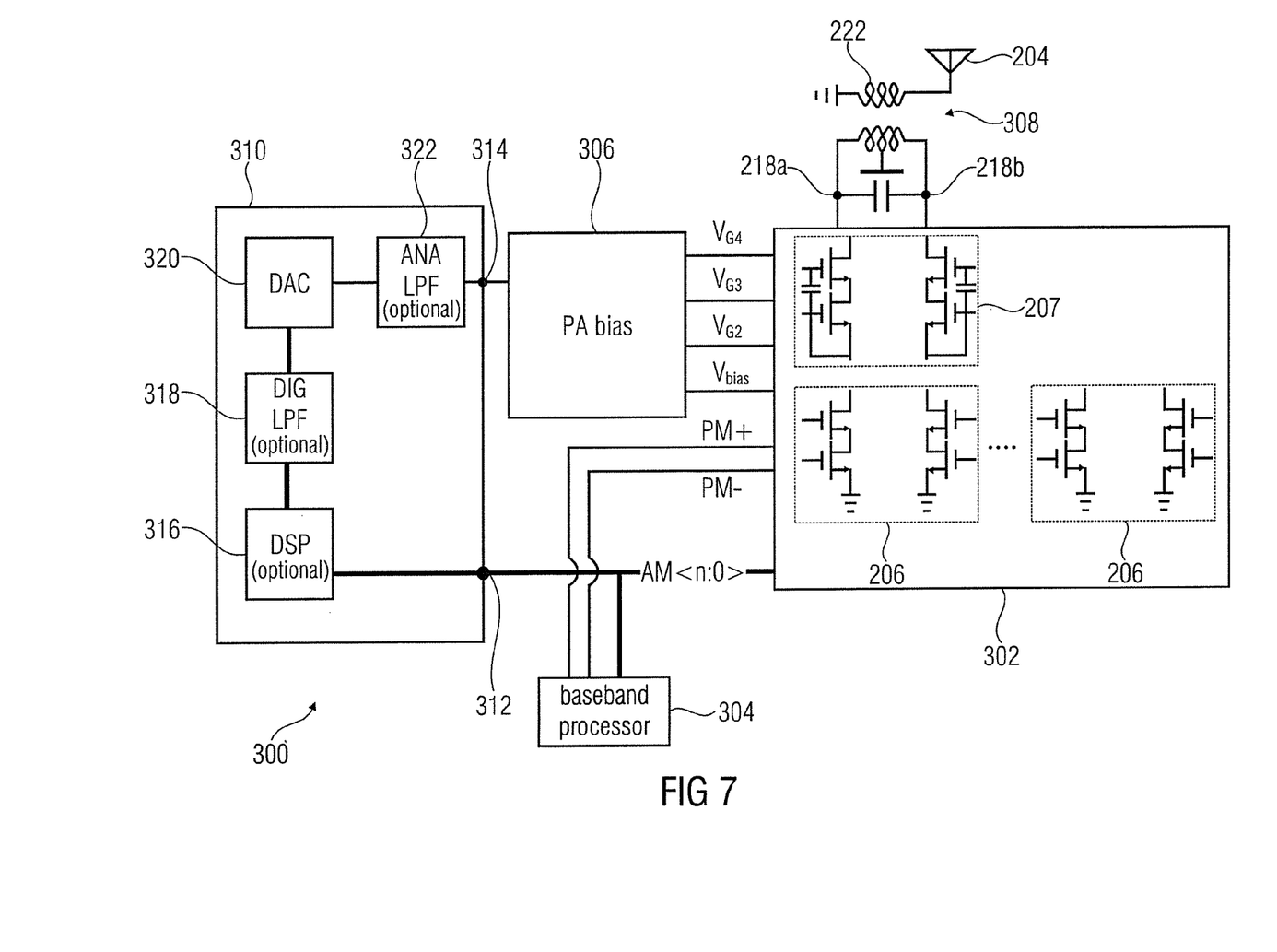
FIG. 7 shows another example of the envelope detector in a transmitter.

FIG. 7 shows another example of the envelope detector 310 in a transmitter 300. In FIG. 7, those elements of the transmitter already described with regard to FIG. 6 have associated the same reference signs and will not be described again. In this example, the envelope detector 310 includes a digital signal processor 316, a digital low-pass filter 318, a digital-to-analog-converter 320 and an analog low-pass filter 322. As can be seen, the digital signal processor 316 is connected to the input 312 and receives the input signal indicative of the magnitude of the baseband signal to be amplified by the transmitter structure 300. The digital low-pass filter 318 receives the processed digital input signal and carries out the low-pass filtering and outputs the low-pass filtered signal to the DAC 320 which, in turn, outputs an analog signal to the analog low-pass filter 322 which outputs the low-pass filtered analog signal to the output 314 as the analog envelope signal that is then provided to the PA bias circuit 306. As is indicated in FIG. 7, blocks 316, 318 and 322 are optional blocks which may be used in specific examples. More specifically, the detector 310 may include all of the blocks 316, 318 and 322, wherein in another example, it may include only one or two of the blocks 316, 318, 322.

In the example of the detector 310 depicted in FIG. 7, the digital magnitude signal provided by the baseband processor 304 to the DAC 302 is also received at the input 312 of the envelope detector 310. The digital signal processor 316 may be provided for digitally pre-processing the digital magnitude stream, for example by performing squaring or double-squaring operations in order to better compensate the effects of odd order non-linearities, for example third order non-linearities, but also higher order non-linearities. Further, in case the baseband processor operates in the Cartesian (I/Q) domain, the DSP 316 may further be provided for receiving from the baseband processor the complex baseband signal, i.e., the I- and Q-signals and generate on the basis of these two signals the magnitude signal in the digital domain (magnitude=the square root of $I^2+Q^2$). By means of the digital low-pass filter 318, the bandwidth of the magnitude signal obtained either from the DSP 316 or directly from the input 312 may be reduced so that the remaining operations can be carried out at a reduced sampling rate, thereby saving power. More specifically, the DAC 320, when using the digital low-pass filter 318, may be operated at a reduced sampling rate, more specifically at a sampling rate which is reduced when compared to the sampling rate of the DAC 302, thereby reducing the power consumption. After the digital-to-analog conversion, the resulting analog signal which may be either a current or a voltage, may be low-pass filtered by the filter 322 in order to attenuate high frequency noise. Low-pass filtering the analog signal may be desired for meeting the requirements regarding the transmitter noise in the receiver band. As mentioned above, the analog signal may be fed to the PA bias circuit 306 and added to one or more static biasing voltages, like a current source biasing voltage or a cascode biasing voltage. The combined biasing voltages effectively inject (modify) the envelope signal to the cascode buffering stage 207, thereby dynamically modifying its weighting point and improving its linearity.

Although some examples have been described in the context of an apparatus, it is clear that these examples also represent a description of the corresponding method, where a block or device corresponds to a method act or a feature of a method act. Analogously, examples described in the context of a method act also represent a description of a corresponding block or item or feature of a corresponding apparatus. Some or all of the method acts may be executed by (or using) a hardware apparatus, like a microprocessor, a programmable computer or an electronic circuit. Some one or more of the most important method acts may be executed by such an apparatus.

The above described is merely illustrative, and it is understood that modifications and variations of the arrangements and the details described herein will be apparent to others skilled in the art. It is the intent, therefore, to be limited only by the scope of the impending claims and not by the specific details presented by way of description and explanation above.

The invention claimed is:

1. An envelope detector comprising:
   an input configured to receive a digital input signal indicative of a magnitude of a digital signal to be amplified by a power amplifier, wherein the digital input signal is at least a portion of the digital signal to be amplified;
   a digital signal processing unit connected to the input and configured to process the digital input signal;
   a digital low-pass filter connected to the digital processing unit and configured to reduce a bandwidth of the processed digital input signal;
   a digital-to-analog converter (DAC) connected to the digital low-pass filter and configured to convert the low-pass filtered, processed digital input signal into an analog signal;
   an analog low-pass filter connected to the DAC and configured to low-pass filter the analog signal for attenuating high frequency noise; and
   an output connected to the analog low-pass filter and configured to output the low-pass filtered analog signal.

2. The envelope detector of claim 1, wherein the digital signal to be amplified is provided in the polar domain, and wherein the digital input signal comprises a magnitude signal of the digital signal.

3. The envelope detector of claim 1, wherein the digital signal to be amplified is provided in the I/O domain, wherein the digital input signal comprises the I-signal and the Q-signal of the digital signal, and wherein the digital signal processing unit is configured to generate a magnitude signal based on the I- and Q-signals.

4. A circuit, comprising:
   an input configured to receive a digital baseband signal, the digital baseband signal comprising a digital signal indicative of a magnitude of a radio frequency (RF) output signal to be transmitted;
   one or more RF-digital to analog converters (RF-DACs) configured to generate the RF output signal based on the digital baseband signal; and
   an envelope detector configured to provide an analog envelope signal to the one or more RF-DACs, wherein the envelope detector comprises;
      an input configured to receive the digital input signal indicative of a magnitude of a signal to be amplified by a power amplifier;
      a circuit configured to generate an analog envelope signal based on the digital input signal; and
      an output configured to output the analog envelope signal.

5. The circuit of claim 4, further comprising a power amplifier bias circuit coupled to the output of the envelope detector and configured to generate a power amplifier bias signal based on the analog envelope signal, the power amplifier bias circuit comprising an output configured to provide the generated power amplifier bias signal.

6. The circuit of claim 5, further comprising a power amplifier comprising an input configured to receive the RF output signal from the RF-DAC, a bias input connected to the output of the power amplifier bias circuit, and an output configured to provide the amplified RF output signal.

7. The circuit of claim 4, further comprising a predistortion stage configured to apply a predefined distortion to the digital baseband signal prior to being provided to the circuit input.

8. A transmitter, comprising:
   an input configured to receive a digital baseband signal, the digital baseband signal comprising a digital signal indicative of a magnitude of an RF output signal to be transmitted;
   one or more RF-DACs configured to generate the RF output signal based on the digital baseband signal;
   an envelope detector configured to provide an analog envelope signal to the one or more RF-DACs, wherein the envelope detector comprises;
      an input configured to receive the digital baseband signal indicative of a magnitude of a signal to be amplified by a power amplifier;
      a circuit configured to generate an analog envelope signal based on the digital input signal; and
      an output configured to output the analog envelope signal;
   a power amplifier bias circuit coupled to the output of the envelope detector and configured to generate a power amplifier bias signal based on the analog envelope signal, the power amplifier bias circuit comprising an output configured to provide the generated power amplifier bias signal; and
   a power amplifier comprising an input configured to receive the RF output signal from the RF-DAC, a bias input connected to the output of the power amplifier bias circuit, and an output configured to provide the amplified RF output signal.

9. The transmitter of claim 8, further comprising an antenna port connected to the output of the power amplifier, and configured to connect an antenna to the output of the power amplifier.

* * * * *